US009159851B2

(12) United States Patent
Liu et al.

(10) Patent No.: US 9,159,851 B2
(45) Date of Patent: Oct. 13, 2015

(54) PHOTOVOLTAIC STRUCTURES HAVING A LIGHT SCATTERING INTERFACE LAYER AND METHODS OF MAKING THE SAME

(75) Inventors: Xiangxin Liu, Beijing (CN); Alvin D. Compaan, Holland, OH (US); Naba Raj Paudel, Toledo, OH (US)

(73) Assignee: The University of Toledo, Toledo, OH (US)

( * ) Notice: Subject to any disclaimer, the term of this patent is extended or adjusted under 35 U.S.C. 154(b) by 344 days.

(21) Appl. No.: 13/699,231

(22) PCT Filed: May 26, 2011

(86) PCT No.: PCT/US2011/038257
§ 371 (c)(1),
(2), (4) Date: Dec. 7, 2012

(87) PCT Pub. No.: WO2011/150290
PCT Pub. Date: Dec. 1, 2011

(65) Prior Publication Data
US 2013/0206217 A1 Aug. 15, 2013

Related U.S. Application Data

(60) Provisional application No. 61/348,709, filed on May 26, 2010.

(51) Int. Cl.
*H01L 31/0296* (2006.01)
*H01L 31/0236* (2006.01)
(Continued)

(52) U.S. Cl.
CPC ...... *H01L 31/02363* (2013.01); *H01L 31/0296* (2013.01); *H01L 31/073* (2013.01); *H01L 31/0749* (2013.01); *H01L 31/1828* (2013.01); *H01L 31/1864* (2013.01); *Y02E 10/52* (2013.01); *Y02E 10/541* (2013.01); *Y02E 10/543* (2013.01)

(58) Field of Classification Search
CPC .............. H01L 31/073; H01L 31/1836; H01L 31/1834; H01L 21/02422; H01L 21/02474; H01L 21/0248; H01L 21/02491; H01L 21/02502; H01L 21/02551; H01L 21/02562; H01L 21/02628
USPC ......................................................... 136/264
See application file for complete search history.

(56) References Cited

U.S. PATENT DOCUMENTS 4,086,555 A 4/1978 Krikorian et al.
4,199,650 A 4/1980 Mirtich et al.
(Continued)

FOREIGN PATENT DOCUMENTS

EP 2138608 A1 12/2009
WO 2009120330 A2 10/2009
(Continued)

OTHER PUBLICATIONS

Haug, F.-J. et al., "Influence of Deposition Conditions on the Thermal Stability of ZnO: Al Films Grown by rf Magnetron Sputtering," J. Vac. Sci. Technol., Jan./Feb. 2001, pp. 171-174, vol. 19.
(Continued)

*Primary Examiner* — Jayne Mershon
(74) *Attorney, Agent, or Firm* — MacMillan, Sobanski & Todd, LLC

(57) ABSTRACT

Photovoltaic (PV) cell structures having an integral light scattering interface layer configured to diffuse or scatter light prior to entering a semiconductor material and methods of making the same are described.

7 Claims, 8 Drawing Sheets

(51) Int. Cl.
*H01L 31/073* (2012.01)
*H01L 31/0749* (2012.01)
*H01L 31/18* (2006.01)

(56) References Cited

U.S. PATENT DOCUMENTS

| | | | |
|---|---|---|---|
| 4,251,286 A | 2/1981 | Barnett | |
| 4,251,289 A | 2/1981 | Moustakas et al. | |
| 4,492,181 A | 1/1985 | Ovshinsky et al. | |
| 4,514,583 A | 4/1985 | Izu et al. | |
| 4,598,306 A | 7/1986 | Nath et al. | |
| 4,611,091 A | 9/1986 | Choudary et al. | |
| 4,612,411 A | 9/1986 | Wieting et al. | |
| 4,663,829 A | 5/1987 | Hartman et al. | |
| 4,729,970 A | 3/1988 | Nath et al. | |
| 4,798,660 A | 1/1989 | Ermer et al. | |
| 4,915,745 A | 4/1990 | Pollock et al. | |
| 5,022,930 A | 6/1991 | Ackerman et al. | |
| 5,078,804 A | 1/1992 | Chen et al. | |
| 5,101,260 A | 3/1992 | Nath et al. | |
| 5,306,646 A | 4/1994 | Lauf | |
| 5,393,675 A | 2/1995 | Compaan | |
| 5,436,204 A | 7/1995 | Albin et al. | |
| 5,474,939 A | 12/1995 | Pollock et al. | |
| 5,486,238 A | 1/1996 | Nakagawa et al. | |
| 5,732,179 A | 3/1998 | Caneau et al. | |
| 5,770,463 A | 6/1998 | Nakagawa et al. | |
| 5,909,632 A | 6/1999 | Gessert | |
| 5,972,527 A | 10/1999 | Kaijou et al. | |
| 6,040,521 A | 3/2000 | Kushiya et al. | |
| 6,110,758 A | 8/2000 | Estrera et al. | |
| 6,136,141 A | 10/2000 | Glatfelter et al. | |
| 6,160,215 A | 12/2000 | Curtin | |
| 6,166,319 A | 12/2000 | Matsuyama | |
| 6,184,057 B1 | 2/2001 | van Andel et al. | |
| 6,331,672 B1 | 12/2001 | Matsuda et al. | |
| 6,372,538 B1 | 4/2002 | Wendt et al. | |
| 6,548,751 B2 | 4/2003 | Pelkus et al. | |
| 6,613,973 B2 | 9/2003 | Mukai et al. | |
| 6,767,762 B2 | 7/2004 | Guha | |
| 6,852,614 B1 | 2/2005 | Compaan et al. | |
| 7,024,153 B2 | 4/2006 | Weiner et al. | |
| 7,087,934 B2 | 8/2006 | Oohata et al. | |
| 7,098,058 B1 | 8/2006 | Karpov et al. | |
| 7,141,863 B1 | 11/2006 | Compaan et al. | |
| 7,179,527 B2 | 2/2007 | Sato et al. | |
| 7,394,016 B2 | 7/2008 | Gronet | |
| 2002/0157703 A1 | 10/2002 | Nakayama et al. | |
| 2003/0228727 A1* | 12/2003 | Guerra | 438/200 |
| 2004/0040506 A1 | 3/2004 | Ovshinsky et al. | |
| 2005/0009228 A1 | 1/2005 | Wu et al. | |
| 2006/0162766 A1 | 7/2006 | Gee et al. | |
| 2006/0278163 A1 | 12/2006 | Ovshinsky et al. | |
| 2007/0000537 A1 | 1/2007 | Leidholm et al. | |
| 2007/0068569 A1* | 3/2007 | Nam et al. | 136/255 |
| 2007/0134516 A1 | 6/2007 | Kim | |
| 2007/0157962 A1 | 7/2007 | Gronet | |
| 2007/0212510 A1 | 9/2007 | Hieslmair et al. | |
| 2007/0221268 A1 | 9/2007 | Hasch | |
| 2007/0235074 A1 | 10/2007 | Henley et al. | |
| 2008/0041436 A1 | 2/2008 | Lau et al. | |
| 2008/0093221 A1 | 4/2008 | Basol | |
| 2008/0115827 A1 | 5/2008 | Woods et al. | |
| 2008/0308148 A1 | 12/2008 | Leidholm et al. | |
| 2009/0078318 A1 | 3/2009 | Meyers et al. | |
| 2009/0098393 A1 | 4/2009 | Anderson et al. | |
| 2009/0211637 A1 | 8/2009 | Eaglesham | |
| 2009/0223551 A1 | 9/2009 | Reddy et al. | |
| 2009/0242029 A1 | 10/2009 | Paulson et al. | |
| 2010/0006144 A1* | 1/2010 | Baumberg et al. | 136/255 |
| 2010/0024870 A1* | 2/2010 | Tsai et al. | 136/252 |
| 2010/0048076 A1 | 2/2010 | Creyghton et al. | |
| 2010/0126580 A1* | 5/2010 | Farrell et al. | 136/256 |
| 2010/0252785 A1* | 10/2010 | Nagatomi et al. | 252/519.1 |
| 2011/0146767 A1* | 6/2011 | Lu | 136/255 |
| 2011/0226336 A1* | 9/2011 | Gerbi et al. | 136/262 |
| 2011/0259424 A1* | 10/2011 | Basol | 136/260 |

FOREIGN PATENT DOCUMENTS

| | | |
|---|---|---|
| WO | 2010144460 A1 | 12/2010 |
| WO | 2011035234 A1 | 3/2011 |
| WO | 2011142804 A1 | 11/2011 |
| WO | 2011142805 A2 | 11/2011 |
| WO | 2011150290 A2 | 12/2011 |

OTHER PUBLICATIONS

Lin, Y.-S. et al. "Surface Modification of Polyimide Films by Argon Plasma for Copper Metallization on Microelectronic Flex Substrates," Journal of Applied Polymer Science, 2006, pp. 744-755, vol. 99.

Mathew, X. et al. "CdTe/CdS Solar Cells on Flexible Substrates," Solar Energy, 2004, pp. 831-838, vol. 77.

Perrenoud, J. et al., "The Use of Aluminium Doped ZnO as Transparent Conductive Oxide for CdS/CdTe Solar Cells," Thin Solid Films, 2011, pp. 7444-7448, vol. 519.

Romeo, A. et al., "High-Efficiency Flexible CdTe Solar Cells on Polymer Substrates," Solar Energy Materials & Solar Cells, 2006, pp. 3407-3415, vol. 90.

Shao, M. et al., "Radio-Frequency-Magnetron-Sputtered CdS/CdTe Solar Cells on Soda-Lime Glass," Appl. Phys. Lett., Nov. 1996, pp. 3045-3047, vol. 69, No. 20.

Kapton Polyimide Films, "Thin Film Substrates", DuPont Photovoltaic Solutions, www.dupont.com, Accessed May 21, 2009, pp. 1-2.

Tiwari, et al., "Flexible CdTe Solar Cells on Polymer Films", Progress in Photovoltaics: Research and Applications, 2001, pp. 211-215, vol. 9.

"Transparent, FLexible Substrates for LCD and Photovoltaic Applications", Akron Polymer Systems, www.akronpolysys.com, Accessed Jun. 2, 2009, p. 1.

"Upilex Polyimide Films", Polyimides, UBE America, Inc., http://northamerica.ube.com, Accessed May 21, 2009, pp. 1-4.

PCT International Search Report and Written Opinion, Application No. PCT/US2010/037788 filed Jun. 8, 2010, dated Aug. 9, 2010.

PCT International Search Report and Written Opinion, Application No. PCT/US2011/000813 filed May 10, 2011, dated Aug. 26, 2011.

PCT International Search Report and Written Opinion, Application No. PCT/US2010/053167 filed Oct. 19, 2010, dated Dec. 27, 2010.

PCT International Search Report and Written Opinion, Application No. PCT/US2010/049476 filed Sep. 20, 2010, dated Nov. 18, 2010.

PCT International Search Report and Written Opinion, Application No. PCT/US2011/000814 filed May 10, 2011, dated Nov. 17, 2011.

PCT International Search Report and Written Opinion, Application No. PCT/US2011/038257 filed May 26, 2011, dated Nov. 23, 2011.

Mexican Office Action, English Translation, Application No. MX/a/2012/013614 dated Jun. 13, 2013.

* cited by examiner

PHOTOVOLTAIC STRUCTURES HAVING A LIGHT SCATTERING INTERFACE LAYER AND METHODS OF MAKING THE SAME

CROSS-REFERENCE TO RELATED APPLICATIONS

This Application claims the benefit of PCT Application No. PCT/US2011/038257 filed May 26, 2011 which claims priority to U.S. Provisional Patent Application Ser. No. 61/348,709 filed May 26, 2010, the disclosures of which are incorporated herein by reference.

STATEMENT REGARDING FEDERALLY SPONSORED RESEARCH

This invention was made with government support under DE-FG08GO18067 awarded by the Department of Energy (DOE). The government has certain rights in the invention.

FIELD OF THE INVENTION

The invention relates generally to photovoltaic cells (PV cells) and methods for the fabrication thereof. More particularly, the invention relates to a method of fabricating a light diffusion (light scattering) layer in thin-film solar cells and thin-film solar cells made using such methods.

BACKGROUND OF THE INVENTION

There is no admission that the background art disclosed in this section legally constitutes prior art.

It would be advantageous to fabricate a light diffusion layer in thin-film solar cells in order to improve the light absorption in extremely thin absorber layers. Thin-film solar cells made using such methods permit the use of much thinner absorber layers and thus facilitate faster manufacturing and less use of expensive absorber layers, thus lessening possible adverse environmental impacts.

SUMMARY OF THE INVENTION

In a first aspect, there is provided herein a PV cell structure that includes an integral light scattering layer. In another aspect, there is provided herein a method of producing a PV cell structure having an integral light scattering layer.

In a broad aspect, there is provided herein a photovoltaic (PV) cell structure, comprising: at least a first layer comprised of a first semiconductor material adjacent to a second layer comprised of a second semiconductor material, the first semiconductor material having a first lattice constant, and the second semiconductor material having a second lattice constant which is different from the first lattice constant; and, at least one light scattering interface layer configured to diffuse or scatter light prior to entering one or more of the first and second layers.

In certain embodiments, the light scattering interface layer has been formed at a boundary between the first and second layers of the semiconductor materials.

In certain embodiments, the light scattering interface layer has been formed in the first layer of the first semiconductor material.

In certain embodiments, the light scattering interface layer has been formed in the second layer of the second semiconductor material.

In certain embodiments, the PV cell structure includes a transparent conducting oxide (TCO) layer adjacent to the first layer, and the light scattering interface layer has been formed in the first layer.

In certain embodiments, one of the first and second layers have been deposited under conditions that place one or more of the first and second layers in compressive stress.

In certain embodiments, the light scattering interface layer has a lattice structure elongated in a direction substantially perpendicular to a plane defined by the first and second layers.

In certain embodiments, the first and second semiconductor materials have a lattice mismatch between each semiconductor material's crystal lattice constant sufficient to cause the formation of the light scattering interface layer.

In certain embodiments, the first and second semiconductor materials have about a 5% lattice mismatch between each semiconductor material's crystal lattice constant.

In certain embodiments, the first and second semiconductor materials have about a 10% lattice mismatch between each semiconductor material's crystal lattice constant.

In certain embodiments, the lattice mismatch is between semiconductor materials CdS and CdTe.

In certain embodiments, the light scattering interface layer is comprised of CdS/CdTe, the light scattering interface layer having a light scattering interface surface on the CdTe side of the light scattering interface layer.

In certain embodiments, the PV cell structure comprises glass/TCO/CdS/CdTe, and the light scattering interface layer is formed between the TCO and CdS layers.

In certain embodiments, the PV cell structure comprises glass/TCO/CdS/CdTe, and the light scattering interface layer is formed between the CdS and CdTe layers.

In certain embodiments, the TCO layer comprises one or more of: $SnO_2$:F, ZnO:Al, $In_2O_3$:Sn.

In certain embodiments, the light scattering interface layer has a thickness in the range of about 0.1 to about 0.5 microns.

In certain embodiments, the light scattering interface layer has a thickness in the range of about 0.1 to about 0.25 microns.

In certain embodiments, the light scattering interface layer comprises CdTe and has a thickness in the range of about 0.2 to about 0.5 microns.

In certain embodiments, the light scattering interface layer has microvoids therein.

In certain embodiments, the light scattering interface layer is characterized by about 20-50% void fraction.

In certain embodiments, the light scattering interface layer is characterized by about 20-50% void fraction, with voids sizes in a range from about 0.1 micron to about 1 micron.

In certain embodiments, a dielectric discontinuity is formed with one or more of the first semiconductor material and the second semiconductor material.

In certain embodiments, the PV structure includes a transparent conducting oxide (TCO) layer, and a dielectric discontinuity is formed with the TCO and the light scattering interface layer.

In certain embodiments, the light scattering interface layer has light scattering properties sufficient to cause incident light rays to scatter or be deflected over a wide range of angles.

In certain embodiments, the light scattering interface layer has been formed between a first layer comprised of a CdS first semiconductor material and a second layer comprised of a CdTe second semiconductor material; the interface layer having light scattering properties sufficient to cause incident light rays to scatter or be deflected over a wide range of angles when the scattered light rays enter the CdTe second semiconductor material layer.

In another broad aspect, there is provided herein use of a light scattering interface layer in a photovoltaic (PV) cell for fabrication of a solar cell.

In another broad aspect, there is provided herein a method for making a light scattering interface layer for a photovoltaic (PV) cell, comprising: depositing at least a first layer of a first semiconductor material adjacent to a second layer of semiconductor materials to form a PV cell structure, the first and second semiconductor materials having different crystal lattice constants, and forming at least one light scattering interface layer configured to diffuse or scatter light prior to entering one or more of the first and second layers.

In certain embodiments, the interface layer is formed by heat treating the first and second layers such that the light scattering interface layer is formed between adjacent surfaces of the first and second layers.

In certain embodiments, the first and second layers are heat treated at temperatures in the range of about 350° C. to about 420° C.

In certain embodiments, the first and second layers are heat treated at temperatures in the range of about 350° C. to about 420° C. and in the presence of vapors of one or more of: $CdCl_2$, $ZnCl_2$, HCl and $Cl_2$.

In certain embodiments, at least one of the first and second layers has been deposited under conditions that place one or more of the first and second layers in compressive stress.

In certain embodiments, the light scattering interface layer is formed in a layering growth process.

In certain embodiments, the light scattering interface layer is formed using nanoparticles during a layering growth process.

In certain embodiments, the light scattering interface layer is formed by using a nanoink process.

In certain embodiments, the light scattering interface layer is formed by a plasma process.

In certain embodiments, at least one of the first and second layers are formed by a magnetron sputtering deposition process.

In certain embodiments, the deposition is performed under conditions that place one or more of the first and second layers in compressive stress.

In certain embodiments, the compressive stress is applied in a plane defined by the first and second layers whereby a lattice is elongated in a direction perpendicular to the plane of the first and second layers.

In certain embodiments, the PV cell structure comprises glass/TCO/CdS/CdTe and the PV cell structure is heat treated at temperatures of about 390° C. Also, in certain embodiments, the CdS/CdTe interface layer has a light scattering diffusion surface on the CdTe side of the interface layer.

In certain embodiments, microvoids are formed in the light scattering interface layer.

In certain embodiments, the light scattering interface layer has been formed between a first layer comprised of a CdS first semiconductor material and a second layer comprised of a CdTe second semiconductor material; the light scattering interface layer having properties sufficient to cause incident light rays to scatter or be deflected over a wide range of angles when the scattered light rays enter the CdTe second semiconductor material layer.

In another broad aspect, there is provided herein a photovoltaic (PV) cell structure having a scattering interface layer, made by one or more of the methods described herein.

In another broad aspect, there is provided herein a photovoltaic (PV) cell structure, comprising: a transparent conducting oxide (TCO) layer; at least a first layer of a first semiconductor material adjacent to the TCO layer; and, a light scattering interface layer that diffuses or scatters light prior to entering the first layer.

In certain embodiments, the light scattering interface layer has been formed at a boundary between the first layer and the TCO layer.

In certain embodiments, the light scattering interface layer has been formed in the first layer of the first semiconductor material.

In certain embodiments, the first layer has been deposited under conditions that places the first layer and the TCO layer in compressive stress.

In certain embodiments, the light scattering interface layer has a lattice structure elongated in a direction substantially perpendicular to a plane defined by the first and second layers.

In certain embodiments, the first layer and the TCO layer have a lattice mismatch to cause the formation of the light scattering interface layer.

In certain embodiments, the first layer and the TCO layer have about a 5% lattice mismatch.

In certain embodiments, the first layer and the TCO layer have about a 10% lattice mismatch.

In certain embodiments, the PV cell structure comprises TCO/CdS/CIGS/Mo/Glass or TCO/CdS/CIGS/Mo/metal sheet or TCO/CdS/CIGS/Mo/polymer, and the light scattering interface layer is formed between the TCO and CdS layers. (CIGS refers to copper-indium-gallium-sulfur or selenium).

In certain embodiments, the TCO layer comprises one or more of: $SnO_2$:F, ZnO:Al, $In_2O_3$:Sn.

In certain embodiments, dielectric discontinuity is formed with the TCO and the light scattering interface layer.

In another broad aspect, there is provided herein a method for making a light scattering interface layer for a photovoltaic (PV) cell, comprising: providing at least a first layer of a first semiconductor material adjacent to a transparent conducting oxide (TCO) layer, and forming at least one light scattering interface layer configured to diffuse or scatter light prior to entering the first layer.

In certain embodiments, the interface layer is formed by heat treating the first layer such that the light scattering interface layer is formed between adjacent surfaces of the first layer and the TCO layer.

In certain embodiments, the first layer is heat treated at temperatures in the range of about 350° C. to about 420° C.

In certain embodiments, the first layer is heat treated at temperatures in the range of about 350° C. to about 420° C. and in the presence of vapors of one or more of: $CdCl_2$, $ZnCl_2$, HCl and $Cl_2$.

In certain embodiments, the light scattering interface layer has been formed at a boundary between the first layer and the TCO layer.

In certain embodiments, the light scattering interface layer has been formed in the first layer.

In certain embodiments, the first layer has been deposited under conditions that place the first layer in compressive stress.

In certain embodiments, the first layer and the TCO layer have a lattice mismatch sufficient to cause the formation of the light scattering interface layer.

In certain embodiments, a dielectric discontinuity is formed with the TCO.

In certain embodiments, the first layer is formed by a magnetron sputtering deposition process.

In certain embodiments, the deposition is performed under conditions that places the first layer in compressive stress.

In certain embodiments, the compressive stress is applied in a plane defined by the first layer whereby a lattice is elongated in a direction perpendicular to the plane of the first layer.

In certain embodiments, the PV cell structure comprises TCO/CdS/CIGS/Mo/Glass or TCO/CdS/CIGS/Mo/metal sheet or TCO/CdS/CIGS/Mo/polymer, and the light scattering interface layer is formed between the TCO and CdS layers. (CIGS refers to copper-indium-gallium-sulfur or selenium).

In another broad aspect, there is provided herein a photovoltaic (PV) cell structure having a scattering interface layer, made by one or more of the method described herein.

In another broad aspect, there is provided herein a photovoltaic (PV) cell structure having a scattering interface layer, made by the one of the methods described herein.

Various aspects of this invention will become apparent to those skilled in the art from the following detailed description of the preferred embodiment, when read in light of the accompanying drawings.

BRIEF DESCRIPTION OF THE DRAWINGS

The patent or application file may contain one or more drawings executed in color and/or one or more photographs. Copies of this patent or patent application publication with color drawing(s) and/or photograph(s) will be provided by the Patent Office upon request and payment of the necessary fee.

FIG. 2E shows a region near the edge of the microporous light scattering layer.

FIG. 2F shows a region near the center of the light scattering layer.

DETAILED DESCRIPTION OF THE INVENTION

Figure 1A:
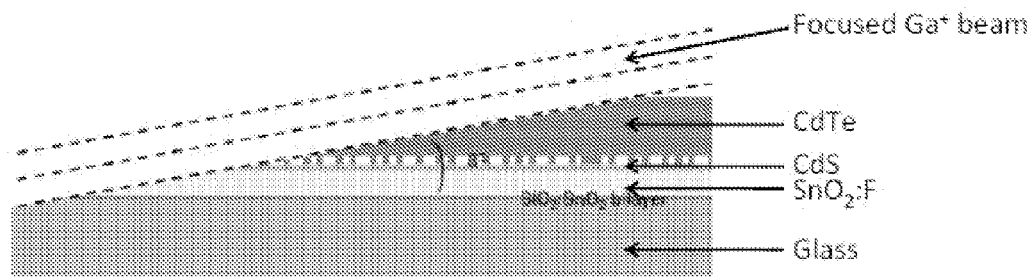
FIG. 1A is a schematic illustration of a CdTe/CdS thin-film PV device structure, without a back contact. A gallium Focused Ion Beam (FIB) can be used to expose the layers from an angle of about 3° to the film surface, in preparation for scanning electron microscope (SEM) imaging.

This invention describes the process of fabricating a very thin light diffusion layer at the entrance to very thin semiconductor absorber layers that can produce very strong light diffusion. This strong light diffusion or scattering greatly enhances the light absorption in absorber layers that are otherwise too thin to absorb fully the incident light.

The method disclosed here is particularly suited to thin-film solar cells. The inventors herein have discovered a method that, in effect, can take advantage of the properties of the deposited layers and is readily scalable to large areas needed for thin-film solar cell manufacturing.

The present invention provides further benefits by reducing the thickness of the absorber layers in thin-film solar cells. For example, the reduced thickness of the absorber layers provides a concurrent reduction in deposition time, less use of expensive materials, and less use of materials that may have environmental impacts.

In one aspect, there is described herein a method for making a very thin, yet strong, light scattering, or light diffusion, layer in an interior interface during the fabrication process of a solar cell. In one embodiment, the thin diffusion layer is fabricated using magnetron sputtering of the layers and a subsequent heat treatment of the solar cell structure. In one example, CdS/CdTe solar cells were fabricated on glass coated with a transparent conducting oxide (TCO) layer.

Further, in certain embodiments, the magnetron sputtering process can be performed under conditions that place the layers in compressive stress. The compression is applied in the plane of the deposited film such that the lattice is elongated in the direction perpendicular to the film plane.

After the deposition of the materials to make the PV cell structure, the PV cell structure (for example, glass/TCO/CdS/CdTe) is heat treated, or annealed, at temperatures in the range of about 350° C. to about 420° C. (in one embodiment, at about 390° C. for a glass/TCO/CdS/CdTe PV cell structure) and in the presence of vapors of $CdCl_2$. This post-deposition heat-treating (also called herein annealing or activation) step transforms the CdS/CdTe interface layer from being compact with very few microscopic voids (about 0.1 to about 1 microns) in either the CdS or the CdTe layers, to a CdS/CdTe interface layer in which a light scattering interface diffusion layer appears in the CdTe side of the interface layer.

In certain embodiments, the inventors have found that the light scattering interface diffusion layer is characterized by as much as 50% void fraction, with void sizes in the range of 0.1 to about 1 micron. Also, in certain embodiments, the thickness of the light scattering interface diffusion layer is about 0.1 to about 0.5 micron, and in certain embodiments, from about 0.1 to about 0.25 microns. As a result, the CdS/CdTe interface layer acquires very strong light scattering properties that cause the light incident rays through the TCO and CdS layer to scatter or be deflected over a wider range of angles so that the light rays will enter the CdTe layer at a wide range of angles. Most of the scattered light rays will be directed at large angles to the perpendicular to the interface layer. Consequently, even in a very thin layer these light rays can be nearly fully absorbed.

Use of the light scattering interface diffusion layer in a PV cell allows for the fabrication of a solar cell with much thinner absorber layers.

The size scale of the pores or voids may be slightly less than to slightly more than the wavelength of sunlight in the media. Consequently, the light scattering can be very strong and is generally described by Mie scattering theory. That is, the light scattering interface layer has light scattering properties sufficient to cause incident light rays to scatter or be deflected over a wide range of angles. In Mie scattering from microvoids or microinclusions of the size range from about 0.1 to 1 μm, light is scattered over the full range of angles from the forward direction (0 degrees) to the backward direction (180 degrees). For enhancing the PV efficiency, scattering near 90 degrees is especially beneficial.

The size of the voids or volumes with different dielectric constant affects the amount of scattering. Thus, by use of the process described herein, it is possible to control the amount of scattering as needed for different wavelengths. For example, in CdTe, the light scattering or diffusion is especially needed in the wavelength region just below the band edge or roughly from 850 nm to 700 nm for CdTe layers of about 0.25 microns.

EXAMPLES

The present invention is further defined in the following Examples, in which all parts and percentages are by weight and degrees are Celsius, unless otherwise stated. It should be understood that these Examples, while indicating preferred embodiments of the invention, are given by way of illustration only. From the above discussion and these Examples, one skilled in the art can ascertain the essential characteristics of this invention, and without departing from the spirit and scope thereof, can make various changes and modifications of the invention to adapt it to various usages and conditions. All publications, including patents and non-patent literature, referred to in this specification are expressly incorporated by reference.

The following examples are intended to illustrate certain preferred embodiments of the invention and should not be interpreted to limit the scope of the invention as defined in the claims, unless so specified. The value of the present invention can thus be seen by reference to the Examples herein.

Example 1

The inventors herein have fabricated high performance solar cells with as thin as 0.25 microns of CdTe. The morphology of the interfacial layer has been revealed by using a scanning electron microscope image (micrograph) after an ion beam etching process known as Low Incidence Surface Milling (LISM) with a Focused Ion Beam (FIB) using Ga ions.

Thin-film photovoltaic devices have a transverse scale of up to a few meters but a thickness of only a couple of microns or less. The morphological features observed in the thickness dimension usually are not observed in the transverse dimension.

Micro-features in the thickness dimension are exposed into planar view for regular electron microscopic studies. The inventors herein have observed, for example, that a 52 nm thick bilayer of $SnO_2$ and buffer layer in TEC glass is extended to about 1 micron (not shown). This method was used to investigate the void morphology and void fraction profile in sputtered CdTe/CdS thin-film devices. Unusual changes are found to occur during standard "activation" annealing with $CdCl_2$ near 390° C. A light scattering layer with thickness of ~100 nm (0.1 micron) appears at the CdTe side of the CdS/CdTe junction.

The inventors have also have studied CdTe/CdS structures deposited at two different sputter geometries, normal incidence and angle deposition at about 45° to a rotating substrate. Films grown in the "classic" system were deposited with a fixed target and substrate configuration at normal incidence, and the films grown in the "AJA" system were deposited at ~45° using a rotating substrate holder.

In various embodiments, different sputtering pressures were used to achieve optimum cell performance; for example, 18 mTorr for the classic system and 10 mTorr for the AJA system, and the inventors FIB-etched through the complete device profile.

Figure 1B:
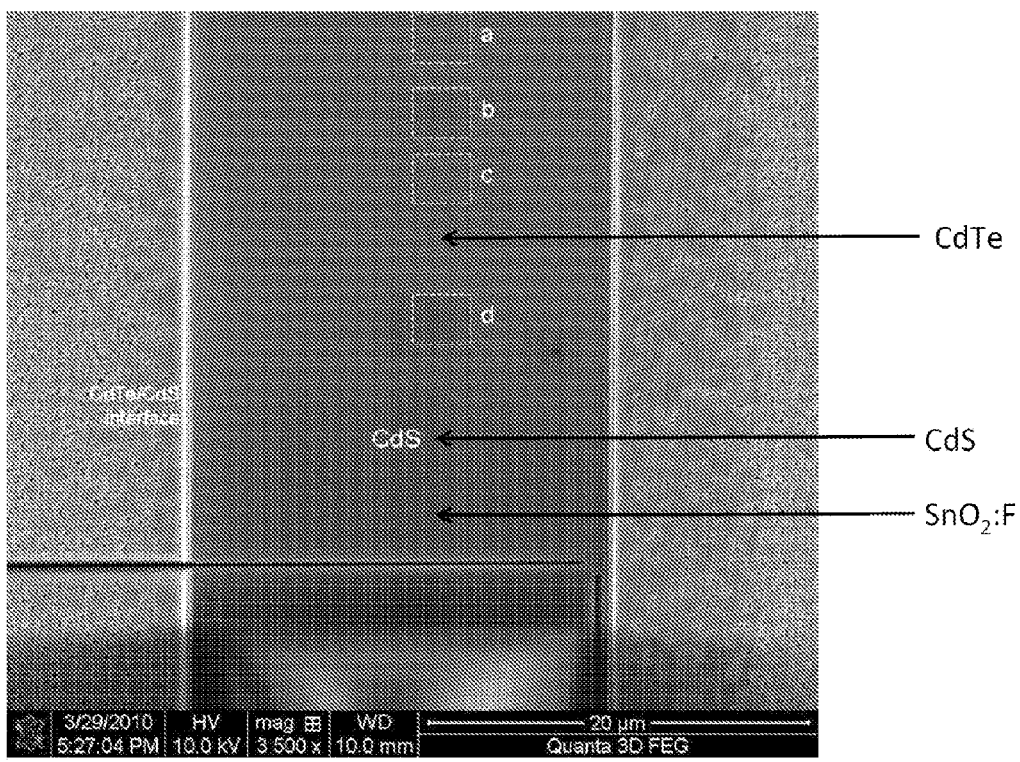
FIG. 1B is a plan-view scanning electron micrograph (SEM) of the cell structure of FIG. 1A showing the rectangular, FIB-exposed structure of the CdTe, CdS, TCO ($SnO_2$), and glass layers of a device deposited at 10 mTorr in a magnetron sputtering system prior to post-deposition heat treatment in $CdCl_2$ vapors. The bright region near the bottom is due to charging of the glass. There is no microporous layer visible in this as-sputtered film structure. Highlighted areas are shown in expanded view in FIGS. 2A, 2B, 2C and 2D.

FIG. 1A is a schematic illustration of a CdTe/CdS thin-film PV device structure, without a back contact. FIG. 1B shows the rectangular, FIB-exposed structure of the CdTe, CdS, TCO ($SnO_2$), and glass layers of a device deposited at 10 mTorr in a magnetron sputtering system and prior to post-deposition heat treatment in $CdCl_2$ vapors. The brighter region near the bottom is due to charging of the glass. FIG. 1B is a plan-view scanning electron micrograph of the cell structure of FIG. 1A and prior to annealing in vapors of $CdCl_2$. FIG. 1B has labeled the glass; the TCO ($SnO_2$:F) layer; the CdS layer; and, the CdTe layer.

Figure 1C:
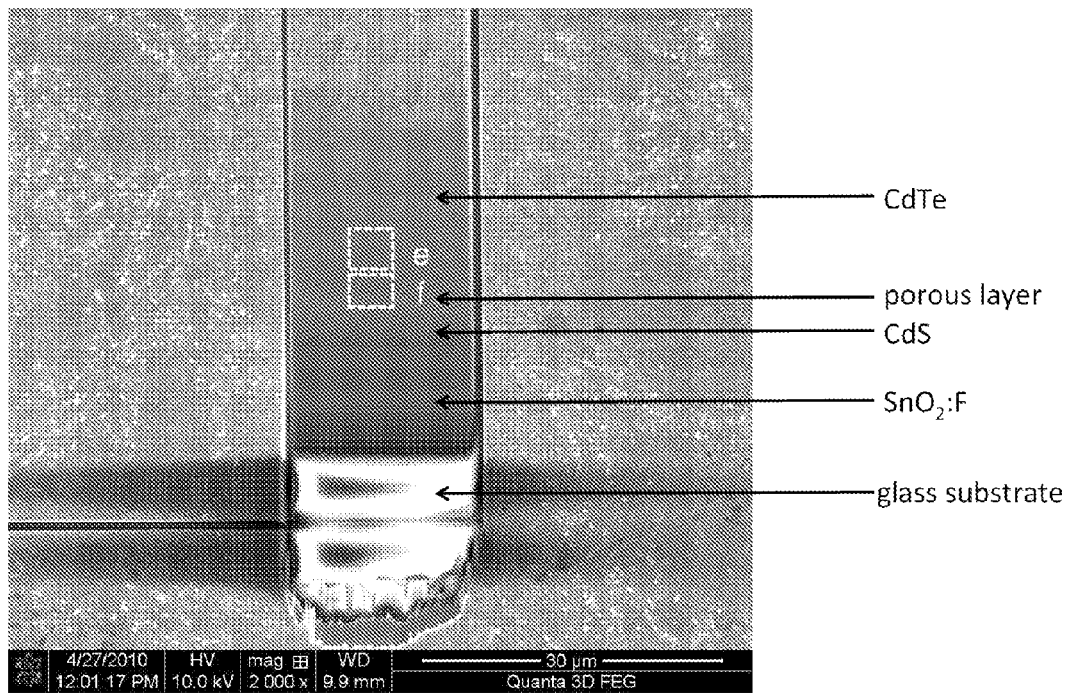
FIG. 1C shows an SEM micrograph, of a sputtered CdTe/CdS photovoltaic structure after CdCl2 activation with a FIB-etched slices. A microporous layer is visible above the CdS region. Expanded views are shown in FIGS. 2E-2F.

FIG. 1C shows an SEM micrograph of a FIB-exposed sputtered CdTe/CdS photovoltaic structure after CdCl2 activation. This device was fabricated using the AJA system at 10 mTorr to deposit 0.1 μm CdS and 1.0 μm CdTe also at 10 mTorr, followed with $CdCl_2$ process at 390° C. for 30 minutes and Cu/Au metal contact deposition by evaporation. The identification of various layers was done by Energy Dispersive x-ray Spectroscopy (EDS) linear scanning (not shown) from the surface of CdTe along the FIB exposed slice until glass, which identified the locations of CdTe/CdS and CdS/SnO2 interfaces. The layer identification was also confirmed by calculating the thicknesses of layers from the observed SEM length, multiplying by tan (3°) and comparing to the inventors' in-situ optical thickness monitor data.

Figure 2A:
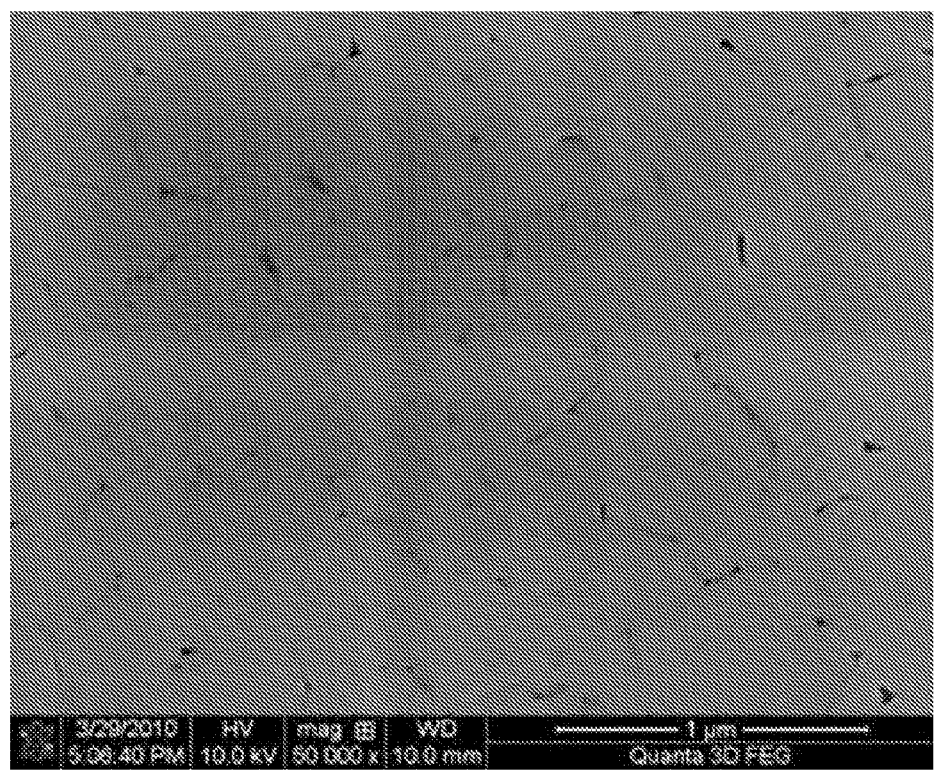
FIGS. 2A-2D. The regions shown in expanded views in FIG. 2A through FIG. 2D correspond to the boxed areas of FIG. 1B and start near the CdTe surface and ends near the light scattering layer just before the CdS layer in as-sputtered films.
Figure 2B:
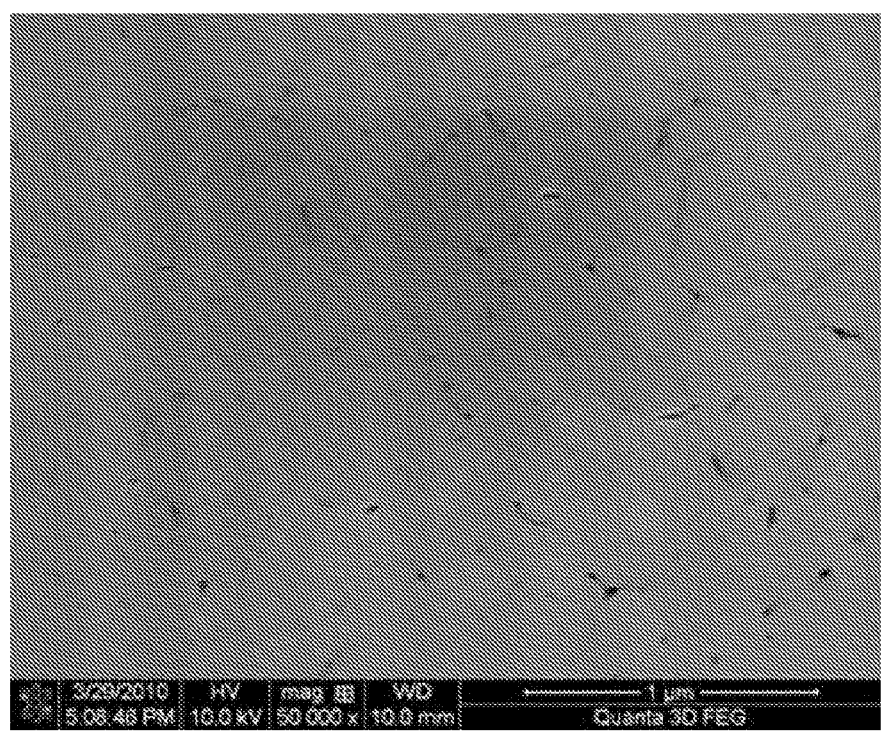
Figure 2C:
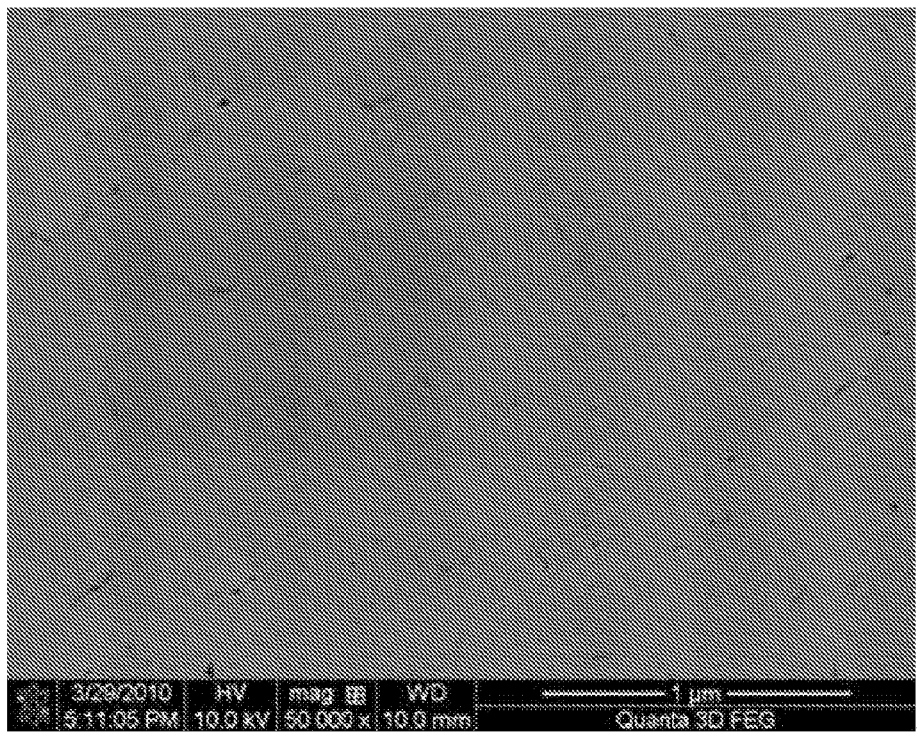
Figure 2D:
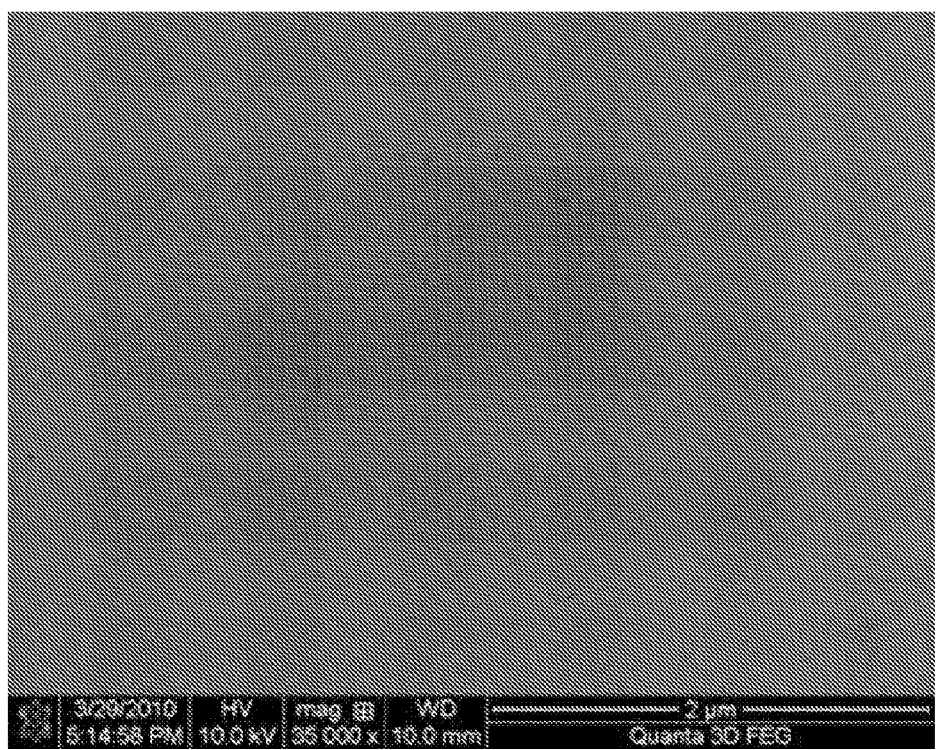

Expanded view micrographs of the CdTe layer of FIG. 1B are shown in FIGS. 2A-2D (see, for example a, b, c, and d in FIG. 1B) illustrating very compact polycrystalline film structures with evidence of grain boundaries in FIG. 2A near the surface or top of the CdTe layer and compact grain boundaries deeper into the CdTe.

Figure 2E:
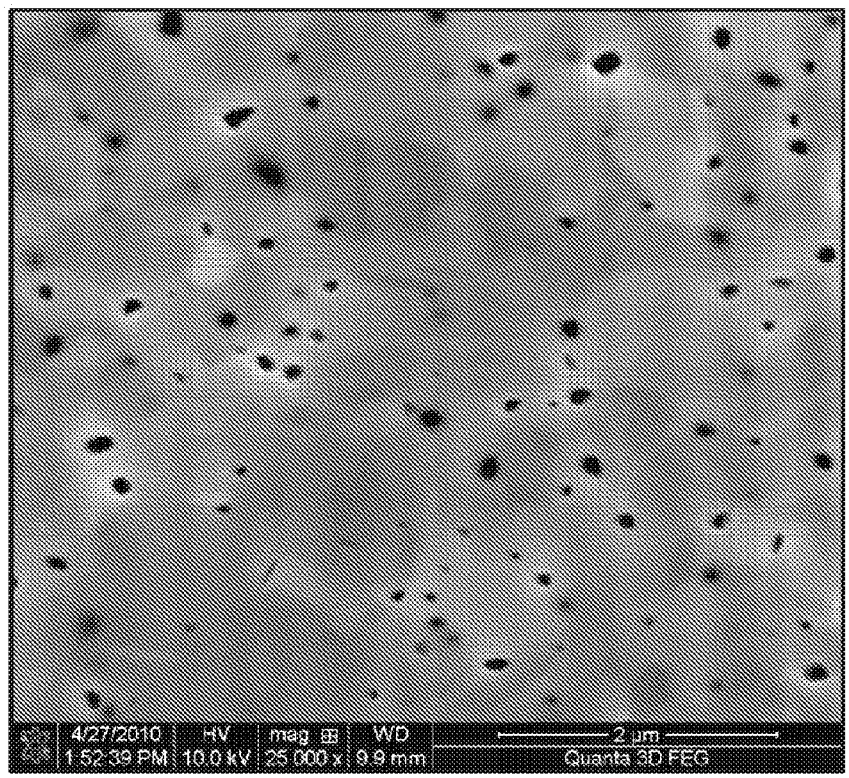
FIGS. 2E-2F shows expanded SEM micrographs, of two FIB-etched areas near the CdTe/CdS interface showing the microporous structure that develops aver $CdCl_2$ annealing. The PV structure was annealed in vapors of $CdCl_2$ after magnetron sputter deposition of the semiconductor layers.
Figure 2F:
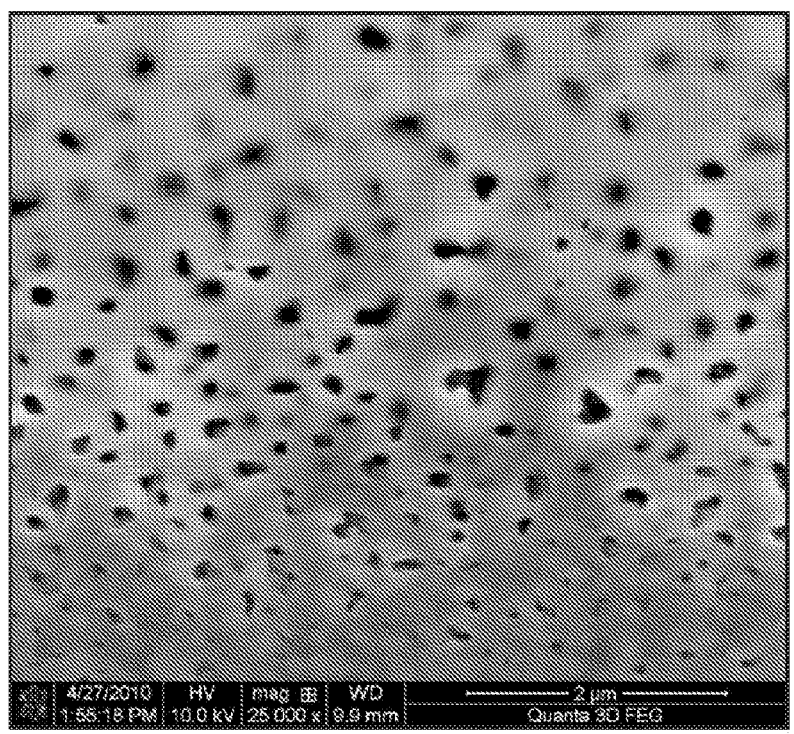

FIG. 2E and FIG. 2F are expanded view micrographs of the microporous light scattering layer that appears in FIG. 1C, with FIG. 2F taken at the middle and FIG. 2E taken toward the edge of the microporous light scattering layer, as shown in areas "f" and "e" of FIG. 1C.

Such a light scattering interface layer appears in sputtered devices for both Classic and AJA films with different shapes, as shown in FIG. 2F. The light scattering interface layer appears, not only in the device with 1.0 μm CdTe layer as shown in FIGS. 2A-2F, but also in devices with 2.4 μm and 0.7 μm CdTe.

FIGS. 1A-C and FIGS. 2A-2F show the effects of chloride activation and film morphological changes where a 3° FIB etch through a 2.2 μm CdTe (sputtered at 10 mT) exposes grain and void morphology. Prior to $CdCl_2$ activation, minor voids are visible at grain boundaries, increasing toward the surface, reaching void fraction, $f_v=\sim5\%$. After $CdCl_2$ activation, voids are more spherical in shape and void fraction, $f_v=\sim8\%$ is uniform through film (not shown). After activation, 0.1 μm porous layer develops on the CdTe side of the CdS/CdTe interface as shown in FIGS. 2E and 2F. It is to be understood that, in certain embodiments, the void volume fraction can be altered by altering the growth conditions.

The light scattering interface layer benefits light collection in very thin CdTe by enhancing light scattering as the light enters the CdTe absorber layer. While not wishing to be bound by theory, the inventors herein now believe that a possible mechanism for the generation of such a light scattering interface layer is the ~10% lattice mismatch between CdS and CdTe and the release of strain during the chloride activation process. However, normal annealing in vacuum, air, or inert atmosphere, without the presence of $CdCl_2$ may also produce a light scattering layer if higher temperatures are used, e.g., about 450° C.

Example 2

The photovoltaic (PV) structures described herein exhibited efficiencies in the 12% to 13+% ranges. Further, these PV structures can thus be considered to be tunable, while providing a PV structure with reduced thicknesses.

Figure 3A:
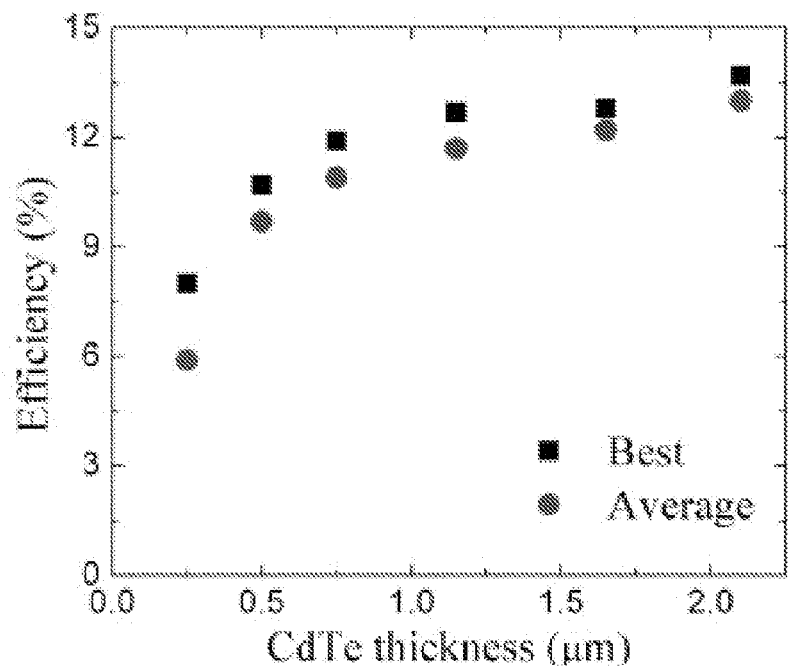
FIG. 3A is a graph showing the efficiency vs. CdTe thickness for a series of cells with the structure of FIG. 1 and suitable back contact. The average is for typically 15 cells. All cells have a light diffusion layer included similar to FIG. 1C and FIGS. 2E-2F. Note that about 8% efficiency is achieved with only 0.25 microns of CdTe.

FIG. 3A is a scatter plot of device efficiency as a function of CdTe layer thickness for a photovoltaic structure in which a light diffusion layer is included for PV structures similar to those shown in FIGS. 2E-2F. FIG. 3A shows the efficiency vs. CdTe thickness for a series of cells with the PV structure of FIGS. 1A-1C having suitable back contacts. (The average is for typically 15 cells). These PV structure can thus be formed with a reduced CdS layer thickness and also facilitates the use of thinner CdTe layers. As can be seen, an efficiency of >11% is achieved with a CdTe thickness of about 0.7 μm.

Figure 3B:
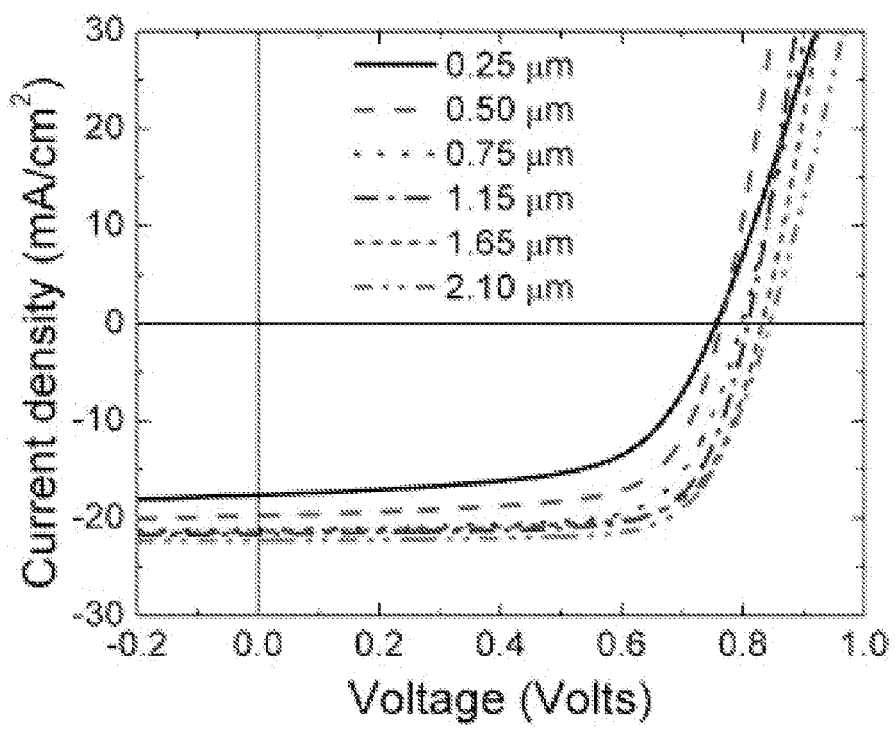
FIG. 3B shows current-voltage (I-V) characteristic of the best cells shown in FIG. 3A.

FIG. 3B shows current-voltage (J-V) characteristic of several of PV structures with a variable CdTe thickness. The PV structures above 1.1 micron were similar to 1.1 micron. Note also that about 8% efficiency is achieved with only 0.25 microns of CdTe.

Example 3

Figure 4A:
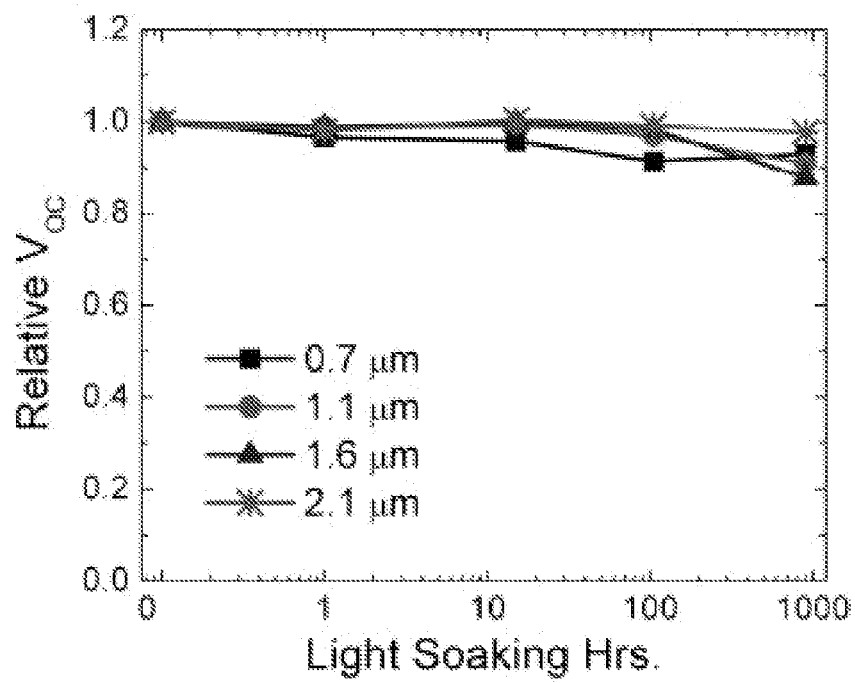
FIG. 4A is a graph showing normalized open-circuit voltage (Voc) of the thin CdTe cells as function of accelerated life testing (ALT) hours. ALT was performed at one sun, 85° C., room air.

FIG. 4A is a graph showing normalized open-circuit voltage (Voc) of the thin CdTe cells as function of accelerated life testing (ALT) hours. ALT was performed at one sun, 85° C., room air. These ALT tests show that even though the device is very thin and the back contact is very close to the main n/p junction at the CdS/CdTe interface, nevertheless the device voltage is stable after exposure to elevated temperatures and when exposed to moisture. Stable Voc under ALT condition of the thin CdTe cells with porous interface layer indicates good junction quality despite of the large voids.

Figure 4B:
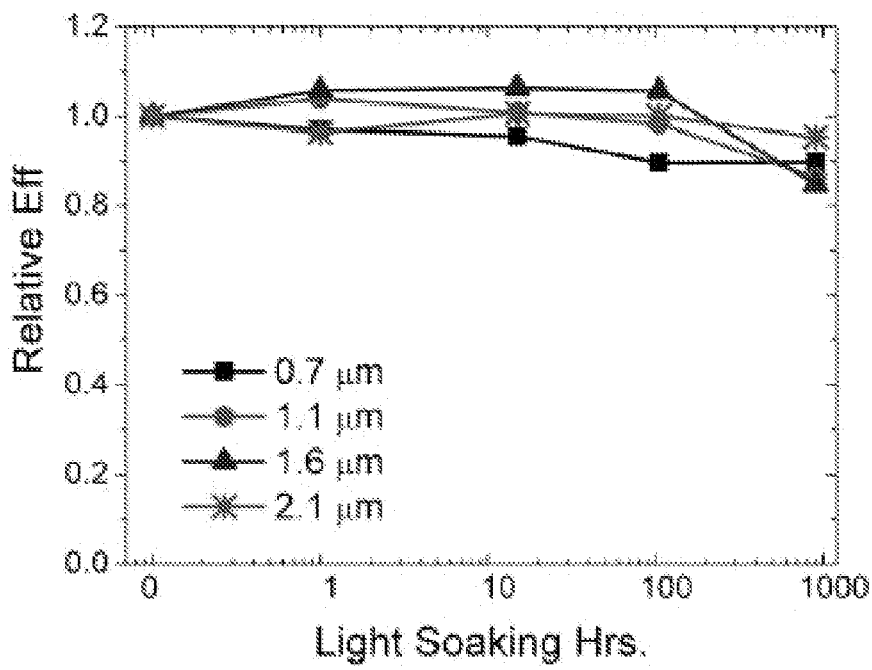
FIG. 4B is a graph showing normalized efficiency of the thin CdTe cells as function of accelerated life testing (ALT) hours. ALT was performed at one sun, 85° C., room air.

FIG. 4B is a graph showing normalized efficiency of the thin CdTe cells as function of accelerated life testing (ALT) hours. ALT was performed at one sun, 85° C., room air. These ALT tests show that even though the device is very thin and the back contact is very close to the main n/p junction at the CdS/CdTe interface, nevertheless the device efficiency is stable after exposure to elevated temperatures and when exposed to moisture.

Example 4

Figure 5:
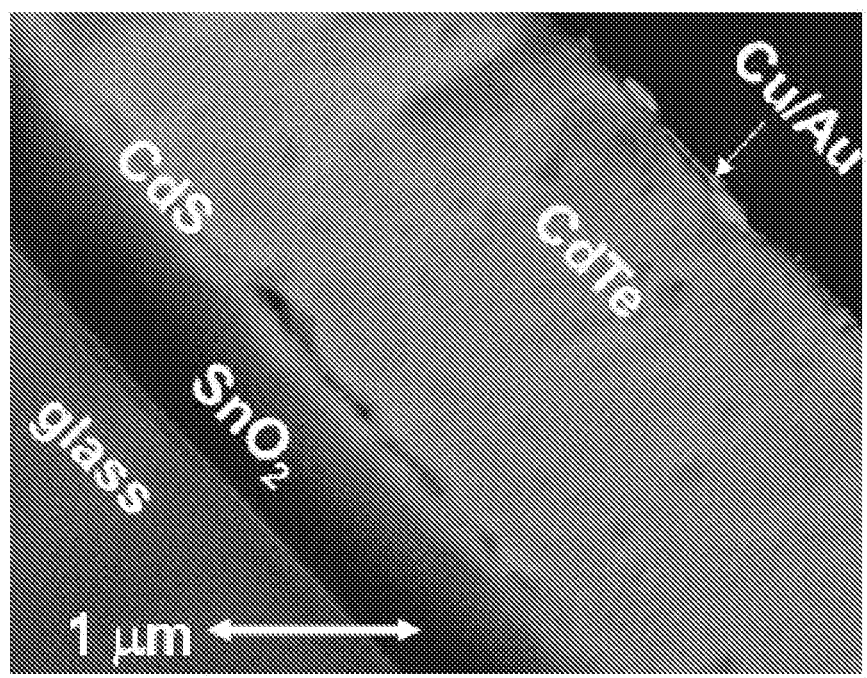
FIG. 5 is a graph showing a transmission electron microscope (TEM) image of complete CdS/CdTe cell structure, including the copper/gold back contact, after fracturing to obtain a cross-section.

FIG. 5 is a transmission electron microscope (TEM) image of complete CdS/CdTe cell structure, including the copper/gold back contact, after fracturing to obtain a cross-section. As can be seen, there is a significant sulfur concentration at the back surface of the CdTe after $CdCl_2$ activation. Porous CdS/CdTe interface is also observable.

Example 5

One method for making a light scattering interface layer during a fabrication process for making a photovoltaic (PV) cell, includes depositing at least one or more layers of semiconductor materials to form a PV cell structure, and heat treating the PV cell structure to create an interface layer between adjacent semiconductor materials that have different crystal lattice constants.

In certain embodiments, the PV cell structure is heat treated to substantially transform the interface layer from having few microscopic voids to an interface layer having a porous interface diffusion layer on at least one side of the interface layer.

Example 6

An alternative method for making a light scattering interface layer, during the fabrication process for a photovoltaic (PV) cell, includes creating a nano-porous interface light diffusing layer. The light scattering layer is formed between two semiconductor layers where the two semiconductor materials have a substantial crystal lattice mismatch under conditions so that large numbers of microscopic voids form on at least one side of the interface, thus creating a nano-porous interface light diffusing layer.

Example 7

An alternative method for making a light scattering interface layer, during the fabrication process for a photovoltaic (PV) cell, includes where the light scattering layer is formed or enhanced by post-deposition heat treatments In certain embodiments, the post-deposition heat treatment is done in an ambient atmosphere that promotes recrystallization. In on nonlimiting example, the ambient atmosphere includes vapors selected from one or more of: $CdCl_2$, $ZnCl_2$, HCl and $Cl_2$.

Example 8

An alternative method for making a light scattering interface layer, during the fabrication process for a photovoltaic (PV) cell, includes where the light scattering layer is formed in or at the boundary of a transparent conducting layer (such as $SnO_2$:F, ZnO:Al, $In_2O_3$:Sn) by controlling the deposition to create a nano-porous layer.

This method is useful with both superstrate cells such as glass/TCO/CdS/CdTe/back contact, and substrate cells such as TCO/CdS/CIGS/Mo/glass.

It is to be understood that there are a variety of ways to control thin film growth to create nano- or micro-voids to achieve a porous layer. The inventors herein wish to note that the TCOs may not be as effective as voids in CdTe because the index of refraction of CdTe is about 3 whereas the TCO index typically is 1.7 to 2.0 and the strength of the light scattering depends on the dielectric discontinuity between the medium and the void which has index of 1.

Example 9

An alternative method for making a light scattering interface layer, during the fabrication process for a photovoltaic (PV) cell, includes where the light scattering layer is formed by controlling the conditions of deposition to form nano-inclusions with a dielectric constant significantly different from the surrounding medium.

It is to be understood that, in vapors and plasmas it is often possible to control conditions so that there is homogeneous nucleation in the vapor or plasma which creates "dust" particles that get incorporated into the film. For example, normal semiconductor growth can be interrupted while a different gas or vapor is introduced long enough to create the layer with inclusions or inclusions plus voids.

Example 10

An alternative method for making a light scattering interface layer, during the fabrication process for a photovoltaic (PV) cell, includes where the light scattering layer is formed in a layering growth process. In one non-limiting example, a liquid phase growth process such as electrodeposition or chemical bath deposition can be temporarily adjusted to create homogeneous nucleation in the liquid or seeded with nanoparticles in order to deposit a thin, light diffusion layer surrounded on both sides by normal film material.

Example 11

An alternative method for making a light scattering interface layer, during the fabrication process for a photovoltaic (PV) cell, includes where the light scattering layer is formed using nanoparticles during a layering growth process. In one non-limiting example, the normal physical vapor deposition process (sputtering, evaporation, close spaced sublimation, etc), can be temporarily seeded with nanoparticles of different material to create a thin light diffusion layer.

Example 12

An alternative method for making a light scattering interface layer, during the fabrication process for a photovoltaic (PV) cell, includes where the light scattering layer is formed by using a nanoink process. For example, this method can be used for growth processes in which the semiconductor layers are deposited near atmospheric pressure with an ink jet process and the thin light diffusion layer is created by seeding the ink with particles of different refractive index.

Example 13

The method described herein creates an interface between two semiconductor materials that have different crystal lattice constants. It should be understood that the crystal lattice constants may be determined in a manner that is acceptable in the industry. It should be further understood that the term "crystal lattice constant" can be generally described as periodic arrangements of atoms in three dimensions, where the lattice constant is the length of periodicity of the lattice, i.e., the minimum distance at which the lattice repeats itself. For example, the lattice mismatch between CdS and CdTe is about 10%.

Examples of Lattice Constants

| Element or Compound | Name | Lattice Constant at 300K (Å) |
|---|---|---|
| Al | Aluminum | 4.050 |
| Ge | Germanium | 5.64613 |
| Si | Silicon | 5.43095 |
| SiC | Silicon carbide | a = 3.086; c = 15.117 |
| GaAs | Gallium arsenide | 5.6533 |
| GaN | Gallium nitride | a = 3.189; c = 5.185 |
| GaP | Gallium phosphide | 5.4512 |
| GaSb | Gallium antimonide | 6.0959 |
| InAs | Indium arsenide | 6.0584 |
| InP | Indium phosphide | 5.8686 |
| InSb | Indium antimonide | 6.4794 |
| $In_2O_3$ | Indium oxide | 10.117 |
| CdS | Cadmium sulfide | 5.8320 |
| CdS | Cadmium sulfide | a = 4.160; c = 6.756 |
| CdSe | Cadmium selenide | 6.050 |
| CdTe | Cadmium telluride | 6.482 |
| ZnO | Zinc oxide | 4.580 |
| ZnS | Zinc sulfide | 5.420 |
| ZnS | Zinc sulfide | a = 3.82; c = 6.26 |
| PbS | Lead sulfide | 5.9362 |
| PbTe | Lead telluride | 6.4620 |
| $SnO_2$ | Tin oxide | a = 4.737; c = 3.186 |

While the invention has been described with reference to particular embodiments, it should be understood by those skilled in the art that various changes may be made and equivalents may be substituted for elements thereof without departing from the essential scope of the invention. In addition, many modifications may be made to adapt a particular situation or material to the teachings of the invention without departing from the essential scope thereof. Therefore, it is intended that the invention not be limited to the particular embodiments disclosed herein contemplated for carrying out this invention, but that the invention will include all embodiments falling within the scope of the claims.

What is claimed is:
1. A photovoltaic cell comprising:
   a first semiconductor layer configured to absorb a first portion of incident light rays and permit a second portion of incident light rays to pass therethrough;
   a second semiconductor layer configured to absorb a wavelength range of the second portion of incident light rays, at least one of the first and second semiconductor layers being annealed; and
   a light scattering interface region formed within one or more of the first and second semiconductor layers at an interface, the light scattering interface region including inclusions configured as one of particulates and voids, the inclusions configured to scatter a wavelength of one of the first and second portions of incident light rays, the inclusions being formed in the one or more of the first and second semiconductor layers during annealing such that the inclusion size is generally equal to the wavelength range of one of the first and second portions of incident light rays;
   wherein the first semiconductor layer is a CdS layer and the second semiconductor layer is a CdTe layer, the CdTe being annealed such that the light scattering interface region is formed in the CdTe layer adjacent to the CdS layer, the light scattering interface region having voids extends from about 20% to about 50% of the CdTe layer thickness,
   the first and second semiconductor material layers exhibiting a compressive stress in a plane defined by the first and second semiconductor material layers, and the light scattering interface region forming a lattice that is elongated in a direction perpendicular to the plane of the first and second semiconductor material layers.

2. The photovoltaic cell of claim 1, wherein the voids are in a size range of about 0.1 microns to about 1 micron.

3. The photovoltaic cell of claim 1, wherein the first semiconductor layer is a CdS layer, and the second semiconductor layer is a CdTe layer deposited such that the CdTe layer has a compressive stress.

4. The photovoltaic cell of claim 3, wherein the CdTe layer has a thickness in the range of 0.2 microns to 2.4 microns.

5. The photovoltaic cell of claim 1, wherein the CdTe layer is annealed in the presence of $CdCl_2$.

6. The photovoltaic cell of claim 1, wherein the first and second semiconductor layers have a lattice mismatch of about 10%, and the inclusions are voids formed in conjunction with a $CdCl_2$ annealing process.

7. A photovoltaic cell comprising:
 a first semiconductor layer configured to absorb a first portion of incident light rays and permit a second portion of incident light rays to pass therethrough;
 a second semiconductor layer configured to absorb a wavelength range of the second portion of incident light rays, at least one of the first and second semiconductor layers being annealed; and
 a light scattering interface region formed within one or more of the first and second semiconductor layers at an interface, the light scattering interface region including inclusions configured as one of particulates and voids, the inclusions configured to scatter a wavelength of one of the first and second portions of incident light rays, the inclusions being formed in the one or more of the first and second semiconductor layers during annealing such that the inclusion size is generally equal to the wavelength range of one of the first and second portions of incident light rays;
 wherein the first semiconductor layer is a CdS layer, and the second semiconductor layer is a CdTe layer deposited such that the CdTe layer has a compressive stress wherein the CdTe layer has a thickness in the range of 0.2 microns to 2.4 microns; and,
 wherein the light scattering interface region is formed within the CdTe layer, the light scattering interface region having a void fraction of about 8%.

* * * * *